United States Patent
Cho et al.

(10) Patent No.: US 9,698,203 B2
(45) Date of Patent: Jul. 4, 2017

(54) ORGANIC LIGHT-EMITTING DIODE DISPLAY WITH CAPACITIVE TOUCH SENSING PATTERNS

(71) Applicant: Samsung Display Co., Ltd., Yongin, Gyeonggi-Do (KR)

(72) Inventors: Sang Hwan Cho, Suwon-si (KR); Jin Koo Kang, Cheonan-si (KR); Soo Youn Kim, Siheung-si (KR); Seung Hun Kim, Hwaseong-si (KR); Hyun Ho Kim, Hwaseong-si (KR); Seung Yong Song, Suwon-si (KR); Cheol Jang, Uiwang-si (KR); Chung Sock Choi, Seoul (KR); Sang Hyun Park, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 131 days.

(21) Appl. No.: 14/527,615

(22) Filed: Oct. 29, 2014

(65) Prior Publication Data

US 2015/0311477 A1 Oct. 29, 2015

(30) Foreign Application Priority Data

Apr. 25, 2014 (KR) ........................ 10-2014-0050305

(51) Int. Cl.
*H01L 27/32* (2006.01)
*H01L 51/52* (2006.01)

(52) U.S. Cl.
CPC ........ *H01L 27/323* (2013.01); *H01L 27/3244* (2013.01); *H01L 51/5284* (2013.01); *H01L 51/5256* (2013.01)

(58) Field of Classification Search
CPC ............. H01L 51/5284; H01L 51/5256; H01L 27/3244; H01L 27/323
See application file for complete search history.

(56) References Cited

U.S. PATENT DOCUMENTS 7,106,307 B2 9/2006 Cok
9,280,242 B2 * 3/2016 Choung .................. G06F 3/044
(Continued)

FOREIGN PATENT DOCUMENTS

KR 10-0978251 B1 8/2010
KR 10-2012-0110885 A 10/2012
(Continued)

*Primary Examiner* — Stephen W Smoot
*Assistant Examiner* — Pavel Ivanov
(74) *Attorney, Agent, or Firm* — Knobbe Martens Olson & Bear LLP

(57) ABSTRACT

An organic light-emitting diode (OLED) display is disclosed. In one aspect, the display includes a substrate and a display layer formed over the substrate and including a pixel area and a non-pixel area. The display also includes an upper thin layer formed over the display layer, wherein the upper thin layer comprises at least first and second conductive layers and a dielectric layer formed between the first and second conductive layers, wherein the second conductive layer is closer to the substrate than the first conductive layer, and wherein the first and second conductive layers are patterned as a touch electrode. The display further includes a light absorbing member at least partially overlapping the non-pixel area and not overlapping the pixel area.

19 Claims, 15 Drawing Sheets

(56) References Cited

U.S. PATENT DOCUMENTS

| | | | |
|---|---|---|---|
| 2006/0097991 A1* | 5/2006 | Hotelling | G06F 3/0416 |
| | | | 345/173 |
| 2010/0007621 A1* | 1/2010 | Kang | G06F 3/044 |
| | | | 345/173 |
| 2011/0310328 A1 | 12/2011 | Kumai | |
| 2012/0062510 A1* | 3/2012 | Mo | G06F 3/044 |
| | | | 345/174 |
| 2012/0147467 A1 | 6/2012 | Park | |
| 2012/0162561 A1* | 6/2012 | Kimura | H01L 27/1218 |
| | | | 349/43 |
| 2012/0168796 A1* | 7/2012 | Moon | H01L 27/322 |
| | | | 257/98 |
| 2013/0009905 A1* | 1/2013 | Castillo | G06F 3/044 |
| | | | 345/174 |
| 2015/0015532 A1* | 1/2015 | Choung | G06F 3/044 |
| | | | 345/174 |

FOREIGN PATENT DOCUMENTS

| | | |
|---|---|---|
| KR | 10-2013-0028284 A | 3/2013 |
| KR | 10-2014-0147199 A | 12/2014 |
| KR | 10-2015-0007062 A | 1/2015 |

\* cited by examiner

ORGANIC LIGHT-EMITTING DIODE DISPLAY WITH CAPACITIVE TOUCH SENSING PATTERNS

INCORPORATION BY REFERENCE TO ANY PRIORITY APPLICATIONS

This application claims priority to and the benefit of Korean Patent Application No. 10-2014-0050305 filed in the Korean Intellectual Property Office on Apr. 25, 2014, the entire contents of which are incorporated herein by reference.

BACKGROUND

Field

The described technology generally relates to an organic light-emitting diode (OLED) display.

Description of the Related Technology

Among image display devices, an organic light-emitting diode display (OLED) is a self-light-emitting type and therefore does not need to include a separate light source. Therefore, OLED technology is advantageous in terms of power consumption, and has excellent response speed, viewing angle, and contrast ratio.

An OLED display includes a plurality of pixels representing primary colors, and thus a full color palette is realized by combining these pixels. Each pixel includes an OLED and a plurality of thin film transistors to drive the OLED.

Each OLED pixel includes a pixel electrode, a common electrode, and a light-emitting layer formed therebetween. One of the pixel electrode and the common electrode is an anode electrode and the other is a cathode electrode. The common electrode is formed over the plurality of pixels and may deliver a constant voltage. The OLED display combines electrons injected from the cathode electrode with holes injected from the anode electrode in the light-emitting layer to form excitons, and emits light while the excitons emits energy.

The OLED display may be divided into a bottom emission type which emits light to a rear surface of a substrate and a top emission type which emits light to a front surface of the substrate. In the case of the top emission type of OLED display, the common electrode is formed of a transparent conductive material.

In the top emission type OLED display, internal light emitted from the light-emitting layer therein is mostly emitted outside the OLED display, but external light incident from the surroundings is partially reflected from various layers of the OLED display, and therefore an image may not be displayed properly. In particular, since a black visual characteristic deteriorates and thus a contrast ratio deteriorates, a polarizer is generally attached around an interface at which the OLED display meets the external environment to reduce the reflection of external light. As the polarizer, a linear polarizer and a circular polarizer including a ¼ wave retarder are generally used.

Display devices having a touch sensor capability are being commercially developed. The touch sensing function means a function of sensing touch information on whether external objects such as a finger and a touch pen touch a screen, a touched position, or the like, when the external objects access or touch a screen. For the touch sensing function, a touch electrode layer including a plurality of touch electrodes may be formed. The touch electrode layer also increases thickness of the display device.

Owing to the polarizer and the touch electrode layers, the thickness of the display device increases. The increase in the thickness of the display device may increase a thickness of a final product and make it difficult to implement a flexible display device.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One inventive aspect is an OLED display having a touch sensing function and that is capable of preventing a light leakage phenomenon due to reflection of external light while reducing a thickness thereof.

Another aspect is an OLED display, including: a substrate; a display layer formed on the substrate and including a pixel area and a non-pixel area; an upper thin layer formed on the display layer and including at least two conductive layers and a dielectric layer therebetween, a first conductive layer of the at least two conductive layers and a second conductive layer formed below the first conductive layer being patterned as a touch electrode; and a light absorbing member formed to overlap the non-pixel area without overlapping the pixel area.

The first conductive layer may include a plurality of first touch electrodes which are arranged in a first direction and a plurality of first dummy patterns which are arranged in a second direction intersecting the first direction and separated from the plurality of first touch electrodes, and the plurality of first touch electrodes may be connected to each other in the first direction.

The second conductive layer includes a plurality of second touch electrodes which are arranged in the second direction and a plurality of second dummy patterns which are arranged in the first direction and separated from the plurality of second touch electrodes, and the plurality of second touch electrodes are connected to each other in the second direction.

The plurality of first touch electrodes of the first conductive layer may substantially overlap the plurality of second dummy patterns of the second conductive layer, and the plurality of first dummy patterns of the first conductive layer may substantially overlap the plurality of second touch electrodes of the second conductive layer.

Each dummy pattern of the first conductive layer may be connected to each of the second touch electrodes of the second conductive layer which overlaps the first conductive layer.

The dummy pattern of the first conductive layer and the second touch electrode of the second conductive layer may be connected to each other through a contact hole which is formed in the dielectric layer between the first conductive layer and the second conductive layer.

The first touch electrode and the second touch electrode may form a mutual sensing capacitor.

The OLED display may further include a third conductive layer formed below the second conductive layer, and the third conductive layer may be substantially equally patterned to the second conductive layer.

The third conductive layer may be patterned so as to not overlap the pixel area.

The third conductive layer may have a greater thickness than that of the first conductive layer and the second conductive layer.

The OLED display may further include an encapsulation layer formed between the display layer and the upper thin layer.

The upper thin layer may further include a dielectric layer which is formed on the first conductive layer.

The light absorbing member may be formed between the encapsulation layer and the upper thin layer, the light absorbing member may be formed between the display layer and the encapsulation layer, or the light absorbing member may be formed on the upper thin layer.

The light absorbing member may include a material selected from carbon black, ink, CrOx/Cr, MoOx/Mo, $Nb_2O_5$/Mo, and CuOx.

The OLED display may further include an encapsulation substrate formed on the upper thin layer, and the first conductive layer may contact the encapsulation substrate. The light absorbing member may be formed to overlap the non-pixel area which is not covered by the first and second conductive layers when viewed from the top.

Another aspect is an organic light-emitting diode (OLED) display, comprising: a substrate; a display layer formed over the substrate and including a pixel area and a non-pixel area; an upper thin layer formed over the display layer, wherein the upper thin layer comprises at least first and second conductive layers and a dielectric layer formed between the first and second conductive layers, wherein the second conductive layer is closer to the substrate than the first conductive layer, and wherein the first and second conductive layers are patterned as a touch electrode; and a light absorbing member at least partially overlapping the non-pixel area and not overlapping the pixel area.

In the above display, the first conductive layer includes a plurality of first touch electrodes arranged in a first direction and a plurality of first dummy patterns arranged in a second direction crossing the first direction and separated from the first touch electrodes, and wherein the first touch electrodes are connected to each other in the first direction. In the above display, the second conductive layer includes a plurality of second touch electrodes arranged in the second direction and a plurality of second dummy patterns arranged in the first direction and separated from the second touch electrodes, and wherein the second touch electrodes are connected to each other in the second direction. In the above display, the first touch electrodes of the first conductive layer substantially overlap the second dummy patterns of the second conductive layer, and the first dummy patterns of the first conductive layer substantially overlap the second touch electrodes of the second conductive layer. In the above display, each dummy pattern of the first conductive layer is connected to each of the second touch electrodes of the second conductive layer which at least partially overlaps the first conductive layer.

In the above display, the dummy pattern of the first conductive layer and the second touch electrode of the second conductive layer are connected to each other through a contact hole which is formed in the dielectric layer between the first conductive layer and the second conductive layer. In the above display, the first touch electrode and the second touch electrode form a mutual sensing capacitor. The above display further comprises: a third conductive layer formed below the second conductive layer, wherein the third conductive layer is substantially equally patterned in thickness toward the second conductive layer. In the above display, the third conductive layer is patterned so as to not overlap the pixel area. In the above display, the third conductive layer has a thickness greater than that of the first conductive layer and the second conductive layer. The above display further comprises: an encapsulation layer formed between the display layer and the upper thin layer.

In the above display, the upper thin layer further includes a dielectric layer which is formed over the first conductive layer. In the above display, the light absorbing member is formed between the encapsulation layer and the upper thin layer. In the above display, the light absorbing member is formed between the display layer and the encapsulation layer. In the above display, the light absorbing member is formed over the upper thin layer. In the above display, the light absorbing member is formed of one or more of the following: carbon black, ink, CrOx/Cr, MoOx/Mo, $Nb_2O_5$/Mo, and CuOx. The above display further comprises: an encapsulation substrate formed over the upper thin layer, wherein the first conductive layer contacts the encapsulation substrate. In the above display, the light absorbing member at least partially overlaps the non-pixel area which is not covered by the first and second conductive layers when viewed from the top.

Another aspect is an organic light-emitting diode (OLED) display, comprising: a pixel area and a non-pixel area formed in and over a substrate; first and second conductive layers, wherein the second conductive layer is closer to the substrate than the first conductive layer, and wherein the first and second conductive layers form a touch electrode; a dielectric layer formed between the first and second conductive layers; and a light absorbing member at least partially overlapping the non-pixel area and not overlapping the pixel area.

In the above display, each of the first and second conductive layers comprises i) a plurality of touch electrodes arranged and connected to each other in a first direction and ii) a plurality of dummy patterns arranged in a second direction crossing the first direction and separated from the touch electrodes.

According to at least one of the disclosed embodiments, it is possible to reduce the thickness of the display device by not allowing the thick polarization layer to perform the anti-reflection function of external light but allowing the multi-layered thin film to perform the anti-reflection function of external light, and it is possible to further reduce the thickness of the display device and the number of manufacturing processes by using the conductive layer of the multi-layered thin film as the touch electrode layer.

In addition, it is possible to improve visibility by minimizing the light leakage phenomenon due to the reflection of external light which may be generated in a gap area between the patterns by patterning the touch electrode.

DETAILED DESCRIPTION OF CERTAIN INVENTIVE EMBODIMENTS

Figure 1:
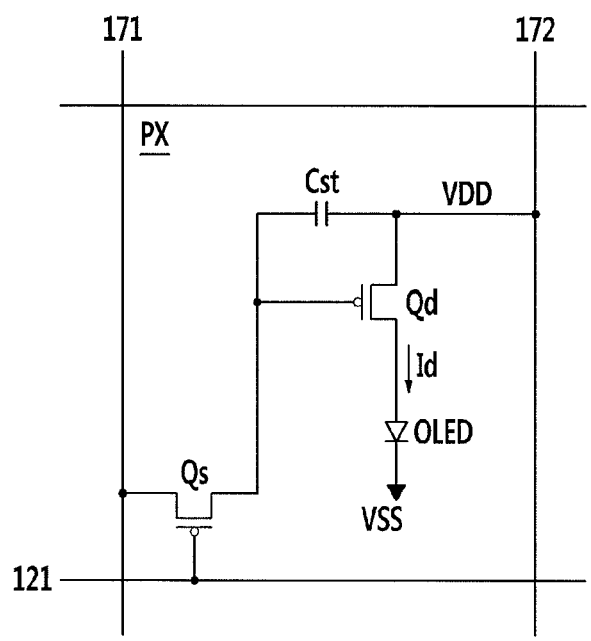
FIG. 1 is an equivalent circuit diagram of one pixel of an OLED display according to an embodiment.

In the following detailed description, only certain exemplary embodiments have been shown and described, simply by way of illustration. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In this disclosure, the term "substantially" includes the meanings of completely, almost completely or to any significant degree under some applications and in accordance with those skilled in the art. Moreover, "formed on" can also mean "formed over." The term "connected" includes an electrical connection. Hereinafter, an OLED display according to an embodiment will be described with reference to the accompanying drawings.

Referring to FIG. 1, the OLED display includes a plurality of signal lines 121, 171, and 172 and a plurality of pixels PXs which are connected thereto and arranged substantially in a matrix form.

The signal line includes a plurality of gate lines 121 which transfer gate signals, a plurality of data lines 171 which transfer data signals, and a plurality of driving voltage lines 172 which transfer a driving voltage VDD. The gate lines 121 extend approximately in a row direction and are substantially parallel with each other, and the driving voltage lines 172 extend approximately in a column direction and are substantially parallel with each other. The gate signal and the data signal may be applied through a display controller.

Each pixel PX includes a switching thin film transistor Qs, a driving thin film transistor Qd, a sustain capacitor Cst, and an OLED.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs transfers the data signal applied to the data line 171 to the driving thin film transistor Qd in response to the gate signal applied to the gate line 121.

The driving thin film transistor Qd also includes a control terminal, an input terminal, and an output terminal. The control terminal is connected to the switching thin film transistor Qs, the input terminal is connected to the driving voltage line 172, and the output terminal is connected to the OLED. The driving thin film transistor Qd transfers an output current Id of which a magnitude varies depending on a voltage applied between the control terminal and the output terminal.

The sustain capacitor Cst is connected between the control terminal and the input terminal of the driving thin film transistor Qd. The sustain capacitor Cst charges the data signal applied to the control terminal of the driving thin film transistor Qd and maintains the charged data signal even after the switching thin film transistor Qs is turned off.

The OLED display includes an anode which is connected to the output terminal of the driving thin film transistor Qd and a cathode which is connected to a common voltage VSS. The OLED display displays an image by emitting light of which the strength varies depending on an output current Id of the driving thin film transistor Qd. The OLED display includes an organic material which may uniquely emit any one of primary colors such as three primary colors of red, green, and blue or at least one light, or an organic material which emits white, and the OLED display displays a desired image by a spatial sum of these colors.

The switching thin film transistor Qs and the driving thin film transistor Qd may be an n-channel field effect transistor (FET) or a p-channel field effect transistor. A connection relationship among the switching and driving thin film transistors Qs and Qd, the storage capacitor Cst, and the OLED display may be changed.

Figure 2:
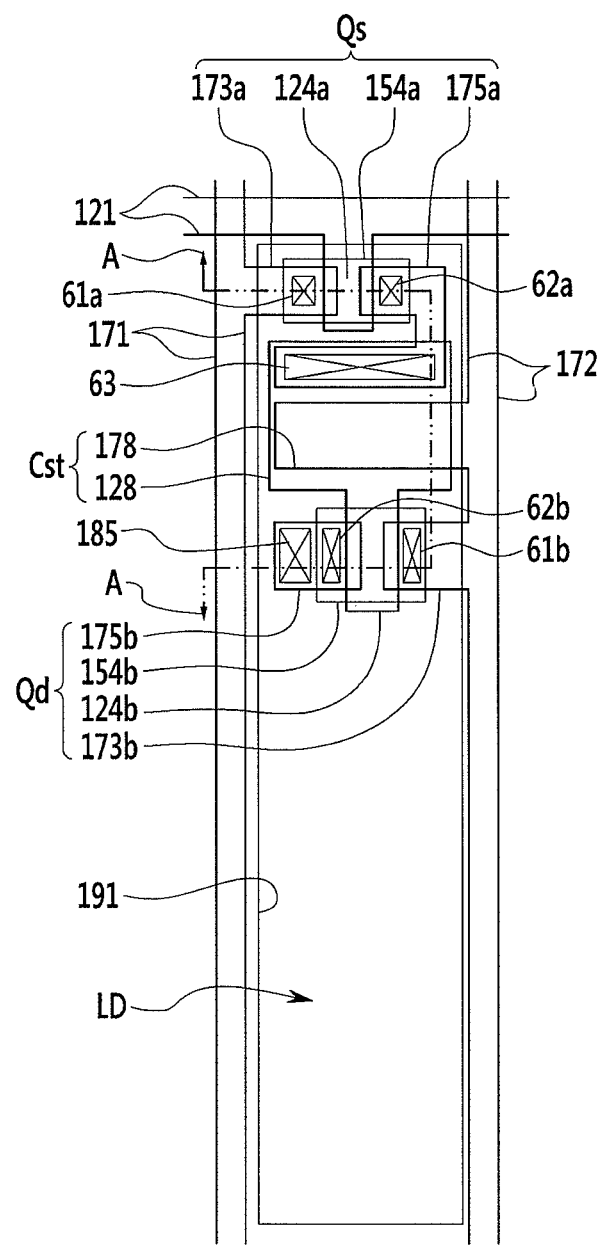
FIG. 2 is a layout view of one pixel of the OLED display according to an embodiment.
Figure 3:
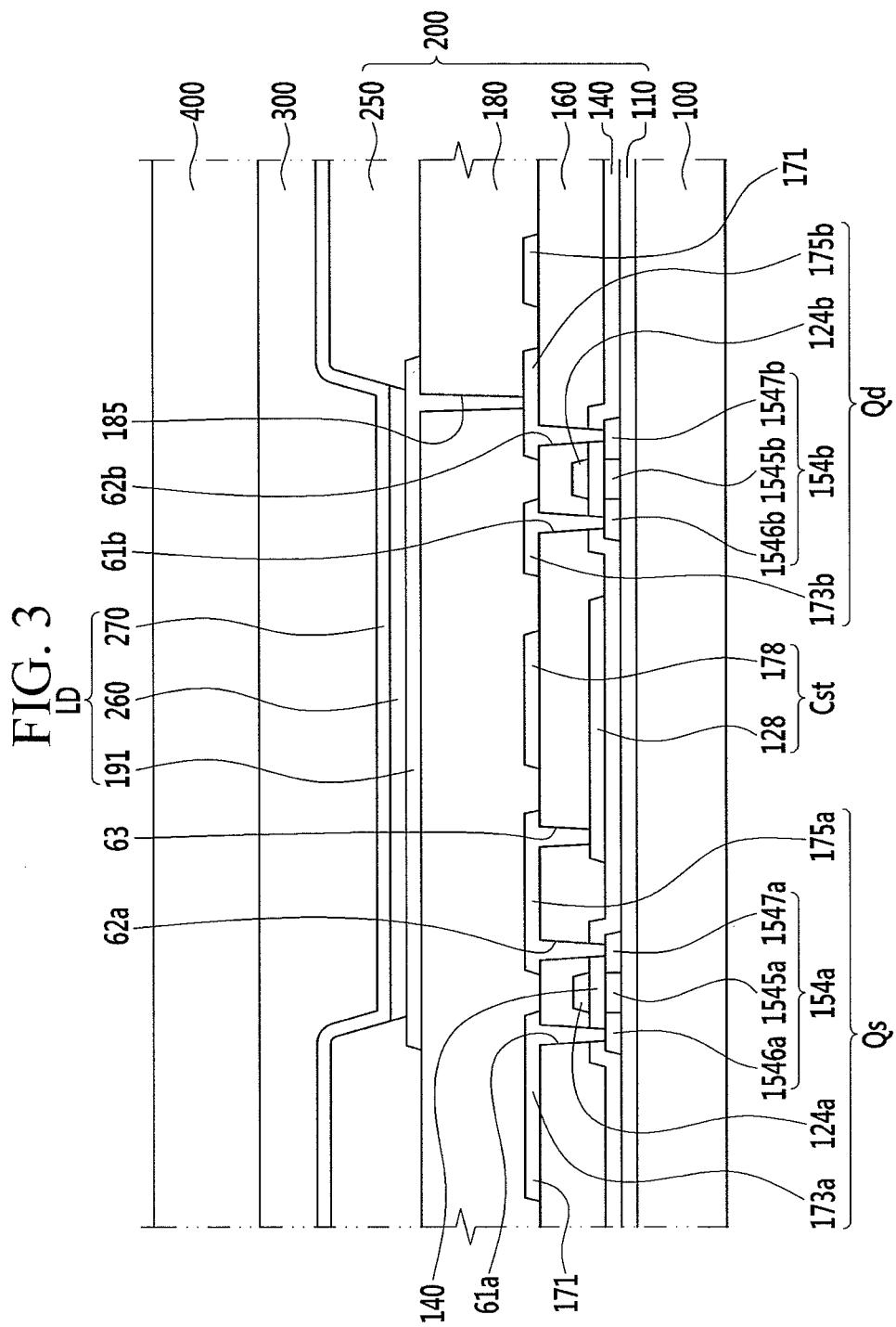
FIG. 3 is a cross-sectional view of the OLED display illustrated in FIG. 2 taken along the line A-A.

Referring to FIGS. 2 and 3, the OLED display includes a substrate 100 and a display layer 200 which is formed on the substrate 100.

The substrate 100 may be a transparent insulating substrate formed of transparent glass, plastic, and the like. In the case of a flexible display device, the substrate 100 may be a flexible substrate formed of a transparent polymer film. For example, the substrate 100 may be formed of a thermoplastic semicrystalline polymer such as polyethylene terephthalate (PET), polyethylene naphthalate (PEN), and polyethylene ether ketone (PEEK), a thermoplastic amorphous polymer such as polycarbonate (PC) and polyethylene sulfonate (PES), and a plastic such as polyimide (PI) and polyarylate (PAR) having relatively high heat resistance.

The display layer 200 includes a buffer layer 110, switching and driving semiconductor layers 154a and 154b, a gate insulating layer 140, the gate line 121, a first capacitor plate 128, an interlayer insulating layer 160, the data line 171, the driving voltage line 172, a switching drain electrode 175a, a driving drain electrode 175b, and a passivation layer 180. The display layer 200 also includes the OLED display and a pixel defining layer 250.

The buffer layer 110 may be formed on the substrate 100 and may include a silicon nitride (SiNx), a silicon oxide (SiOx), a silicon oxynitride (SiOxNy), and the like, and may be formed in a single layer or a multilayer The buffer layer 110 serves to prevent impurities, moisture, or external air degrading semiconductor characteristics from permeating and serves to planarize the surface. According to the exemplary embodiment of the present invention, the buffer layer 110 may be formed in the substrate 100. For example, the substrate 100 may have a structure in which the polymer film (plastic layer) and the buffer layer are alternately stacked as a multilayer.

The switching semiconductor layer 154a and the driving semiconductor layer 154b are formed on the buffer layer 110, and are spaced apart from each other. The switching semiconductor layer 154a and the driving semiconductor layer 154b are formed of polycrystalline silicon, and include channel regions 1545a and 1545b, source regions 1546a and 1546b, and drain regions 1547a and 1547b. The source regions 1546a and 1546b and the drain regions 1547a and 1547b are formed at respective sides of the channel regions 1545a and 1545b.

The channel regions 1545a and 1545b are intrinsic semiconductors which are not doped with an impurity, and the source regions 1546a and 1546b and the drain regions 1547a and the 1547b are impurity semiconductors which are doped with a conductive impurity.

The gate insulating layer 140 is formed on the channel regions 1545a and 1545b of the switching semiconductor layer 154a and the driving semiconductor layer 154b. The gate insulating layer 140 may be formed in a single layer or a multilayer which includes at least one of a silicon nitride and a silicon oxide.

The gate line 121 and the first capacitor plate 128 are formed on the gate insulating layer 140.

The gate line 121 extends in a horizontal direction to transfer the gate signal, and includes a switching gate electrode 124a which protrudes from the gate line 121 to the switching semiconductor layer 154a. The first capacitor plate 128 includes a driving gate electrode 124b which protrudes from the first capacitor plate 128 to the driving semiconductor layer 154b. The switching gate electrode 124a and the driving gate electrode 124b respectively overlap the channel regions 1545a and 1545b.

The interlayer insulating layer 160 is formed on the gate line 121, the first capacitor plate 128, and the buffer layer 110. The interlayer insulating layer 160 is provided with a switching source contact hole 61a and a switching drain contact hole 62a through which the source region 1546a and the drain region 1547a of the switching semiconductor layer 154a are each exposed. Further, the interlayer insulating layer 160 is provided with a driving source contact hole 61b and a driving drain contact hole 62b through which the driving semiconductor layer 154b, the source region 1546b, and the drain region 1547b are each exposed.

The data line 171, the driving voltage line 172, the switching drain electrode 175a, and the driving drain electrode 175b are formed on the interlayer insulating layer 160.

The data line 171 transfers the data signal and extends in an intersecting direction with the gate line 121, and includes a switching source electrode 173a which protrudes toward the switching semiconductor layer 154a from the data line 171.

The driving voltage line 172 transfers the driving voltage, is separated from the data line 171, and extends in the same direction as the data line 171. The driving voltage line 172 includes a driving source electrode 173b which protrudes toward the driving semiconductor layer 154b from the driving voltage line 172, and a second capacitor plate 178 which protrudes from the driving voltage line 172 to overlap the first capacitor plate 128. The first capacitor plate 128 and the second capacitor plate 178 form the storage capacitor Cst using the interlayer insulating layer 160 as a dielectric material.

The switching drain electrode 175a faces the switching source electrode 173a and the driving drain electrode 175b faces the driving source electrode 173b.

The switching source electrode 173a and the switching drain electrode 175a are each connected to the source region 1546a and the drain region 1547a of the switching semiconductor layer 154a through the switching source contact hole 61a and the switching drain contact hole 62a. Further, the switching drain electrode 175a is electrically connected to the first capacitor plate 128 and the driving gate electrode 124b through a first contact hole 63 which extends to be formed in the interlayer insulating layer 160.

The driving source electrode 173b and the driving drain electrode 175b are respectively connected to the source region 1546b and the drain region 1547b of the driving semiconductor layer 154b through the driving source contact hole 61b and the driving drain contact hole 62b.

The switching semiconductor layer 154a, the switching gate electrode 124a, the switching source electrode 173a, and the switching drain electrode 175a form the switching thin film transistor Qs, and the driving semiconductor layer 154b, the driving gate electrode 124b, the driving source electrode 173b, and the driving drain electrode 175b form the driving thin film transistor Qd.

The passivation layer 180 is formed on the data line 171, the driving voltage line 172, the switching drain electrode 175a, and the driving drain electrode 175b. The passivation layer 180 is provided with a second contact hole 185 which exposes the driving drain electrode 175b.

The OLED and the pixel defining layer 250 are formed on the passivation layer 180.

The OLED includes a pixel electrode 191, an organic light-emitting layer 260, and a common electrode 270.

The pixel electrode 191 is formed on the passivation layer 180 and is electrically connected to the driving drain electrode 175b of the driving thin film transistor Qd through the second contact hole 185 formed on the interlayer insulating layer 160. The pixel electrode 191 becomes the anode of the OLED. The pixel electrode 191 may be formed of a reflective metal such as lithium (Li), calcium (Ca), lithium fluoride/calcium (LiF/Ca), lithium fluoride/aluminum (LiF/Al), aluminum (Al), silver (Ag), magnesium (Mg), and gold (Au).

The pixel defining layer 250 is formed on an edge portion of the pixel electrode 191 and the passivation layer 180. The pixel defining layer 250 has an opening through which the pixel electrode 191 is exposed. When viewed from the top, an area in which the pixel defining layer 250 is formed may correspond to a non-pixel area, and the opening through which the pixel electrode 191 is exposed may correspond to a pixel area. The pixel defining layer 250 may be formed of a resin such as polyacrylates and polyimides.

The organic light-emitting layer 260 is formed on the pixel electrode 191 within the opening of the pixel defining layer 250. The organic light-emitting layer 260 includes the light-emitting layer and is formed as a multilayer including at least one of a hole injection layer (HIL), a hole transport layer (HTL), an electron transport layer (ETL), and an electron injection layer (EIL). When the organic light-emitting layer 260 includes both of them, the hole injection layer is formed on the pixel electrode 191 which is the anode, and the hole transport layer, the light-emitting layer, the electron transport layer, and the electron injection layer may be sequentially stacked thereon.

The organic light-emitting layer 260 may include a red organic light-emitting layer, a green organic light-emitting layer, and a blue organic light-emitting layer which emit red, green, and blue colors, respectively, in which the red organic light-emitting layer, the green organic light-emitting layer, and the blue organic light-emitting layer are formed in a red pixel, a green pixel, and a blue pixel to implement color images. The organic light-emitting layer 260 may implement the color images by stacking the red organic light-emitting layer, the green organic light-emitting layer, and the blue organic light-emitting layer in all of the red pixel, the green pixel, and the blue pixel and forming a red filter, a green filter, and a blue filter for each pixel.

The common electrode 270 is formed on the pixel defining layer 250 and the organic light-emitting layer 260. The common electrode 270 is formed by thinly stacking metals such as lithium, calcium, lithium fluoride/calcium, lithium fluoride/aluminum, aluminum, silver, magnesium, gold, or the like so as to have light transmittance, or may be formed of transparent conductive materials such as ITO, IZO, ZnO, $In_2O_3$, and the like. The common electrode 270 becomes the cathode of the light-emitting device LD.

An encapsulation layer 300 is formed on the common electrode 270. The encapsulation layer 300 encapsulates the light-emitting device LD to be able to prevent moisture and/or oxygen from permeating from the outside. The encapsulation layer 300 may include a plurality of encapsulating thin films. For example, the encapsulation layer 300 may include at least one inorganic layer (not illustrated) and at least one organic layer (not illustrated), in which the inorganic layer and the organic layer may be alternately stacked.

The inorganic layer may be a single layer or a multilayer which includes a metal oxide or a metal nitride. For example, the inorganic layer may include any one of a silicon nitride (SiNx), an aluminum oxide (AlOx), a silicon oxide (SiOx), and a titanium oxide (TiOx). An uppermost layer exposed to the outside in the encapsulation layer 300 may be formed of the inorganic layer to prevent water from permeating into the light-emitting device LD.

The organic layer is formed of polymer and may be, for example, a single layer or a multilayer which is formed of any one of polyethylene terephthalate (PET), polyimide (PI), polycarbonate (PC), epoxy, polyethylene (PE), and polyacrylate (PA).

An upper thin layer 400 is formed on the encapsulation layer 300. The upper thin layer 400 serves as an anti-reflection layer which reduces reflection of external light to improve a contrast ratio and visibility. The upper thin layer 400 also serves as a touch electrode layer which may sense a touch of external objects. Therefore, the organic light-emitting diode display according to the exemplary embodiment of the present invention does not require a thick polarizer which is generally used to reduce the reflection of external light, and the upper thin layer serves as the anti-reflection and the touch electrode layer. Removing the thick polarizer including a stretched film is advantageous in implementing the flexible display device, in particular, a foldable display device.

Hereinafter, the upper thin layer 400 according to an exemplary embodiment of the present invention will be described in detail with reference to FIGS. 4 to 9.

Figure 4:
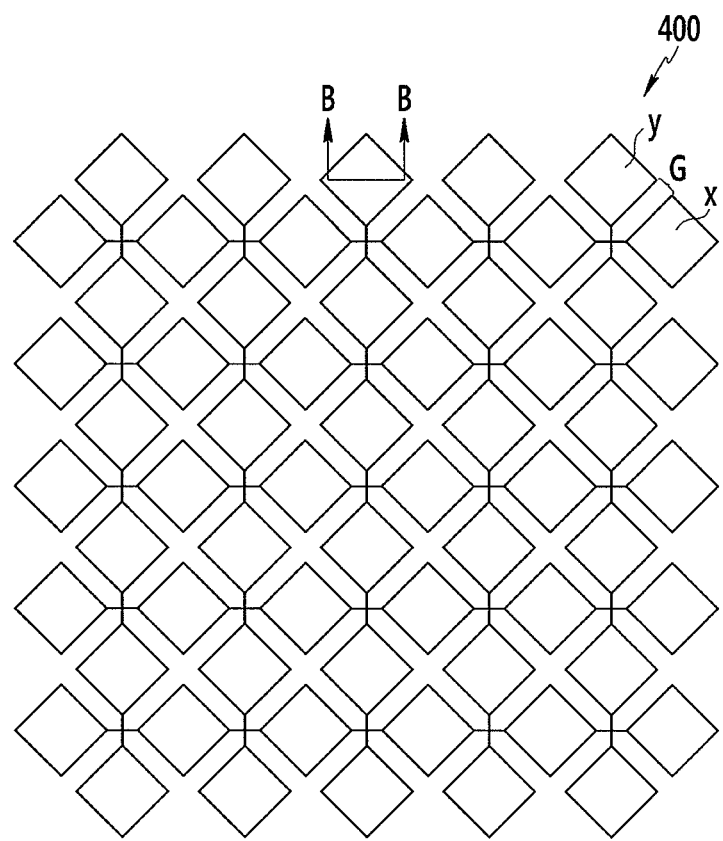
FIG. 4 is a plan view of a top thin layer of the OLED display according to an embodiment.
Figure 5:
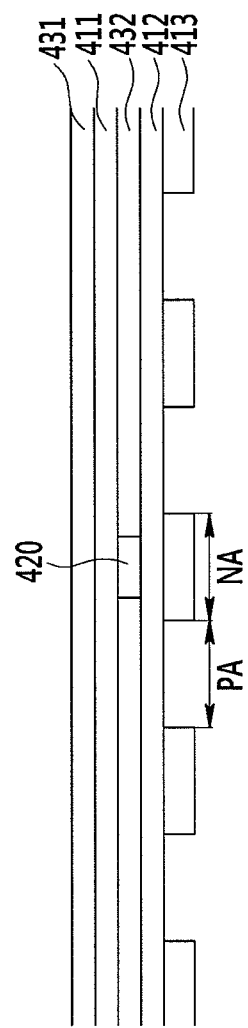
FIG. 5 is a cross-sectional view of the upper thin layer illustrated in FIG. 4 taken along the line B-B.

Referring to FIGS. 4 and 5, the upper thin layer 400 may include at least one conductive layer and at least one dielectric layer which are alternately stacked. For example, as illustrated in FIG. 5, the upper thin layer 400 may include a first dielectric layer 431, a first conductive layer 411, a second dielectric layer 432, and a second conductive layer 412 from the top.

The first and second conductive layers 411 and 412 may include metals such as Cr, Ti, Mo, Co, Ni, W, Al, Ag, Au, Cu, Fe, Mg, and Pt, or alloys thereof, and may be metal layers. The first and second conductive layers 411 and 412 may have a thickness of several to tens of nanometers, for example, about 3 to 20 nm. The thickness of the first conductive layer 411 may be equal to that of the second conductive layer 412.

The first and second dielectric layers 431 and 432 may include an oxide such as $SiO_x$, $Al_2O_3$, $SnO_2$, ITO, IZO, ZnO, $Ta_2O_5$, $Nb_2O_5$, $HfO_2$, $TiO_2$, and $In_2O_3$, and may also include $SiN_x$, $MgF_2$, $CaF_2$, and the like. The thickness of the first and second dielectric layers 431 and 432 may be controlled to cause optical destructive interference and may be, for example, tens to hundreds of nanometers. The first and second dielectric layers 431 and 432 may serve to control a phase difference of light and compensate for a phase.

As described above, the upper thin layer 400 including a plurality of layers uses the destructive interference phenomenon to be able to reduce the reflection of external light, thereby improving the contrast ratio and visibility of the image. In detail, the external light reflected from the inside of the OLED display and light reflected from an inter-layer interface surface of the upper thin layer 400 destructively interfere with each other or are absorbed when transmitting through the conductive layers 411 and 412 to be able to reduce the reflected external light emitted to the outside.

A third conductive layer 413 that is thicker than the second conductive layer 412 may be formed below the second conductive layer 412 while contacting the second conductive layer 412. The third conductive layer 413 may be formed to further reduce light transmittance to, for example, about 10% or less, and may be patterned only in the non-pixel area so as to not hinder the internal light emitted from the OLED from being emitted outside the display device. In other words, the third conductive layer 413 is formed to overlap the pixel defining layer area which is the non-pixel area without overlapping in the pixel area, thereby minimizing the reflection generated in the pixel defining layer area. A dielectric layer (not illustrated) may also be formed between the third conductive layer 413 and the second conductive layer 412, and the third conductive layer 413 may be omitted.

Figure 6:
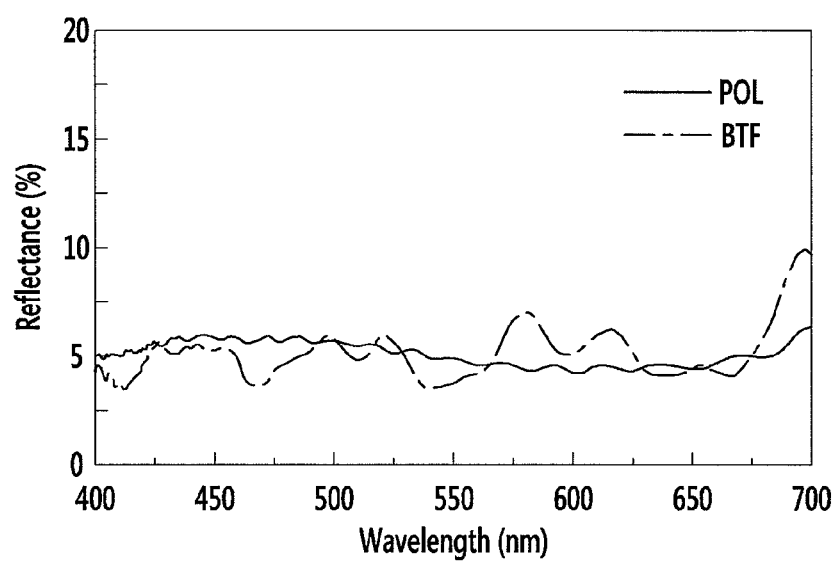
FIG. 6 is a comparison graph of anti-reflection capability of the upper thin layer illustrated in FIG. 4 with that of a general polarizer.

FIG. 6 is a comparison graph of reflectance of external light when the upper thin layer 400 which is the multi-layered thin layer formed of the conductive layer and the dielectric layer is used as the anti-reflection layer with reflectance of external light when the polarizer is used. As illustrated, it may be appreciated that both of the upper thin layer and the polarizer have reflectance of external light of about 5% or so over the entire range of a visible light wavelength. This means that the upper thin layer 400 obtains substantially the same level of reflectance of external light as that of the polarizer while reducing the thickness of the display device more than in the case of using the polarizer.

The example in which the upper thin layer 400 used as the anti-reflection layer instead of the polarizer is used as the touch electrode layer including a plurality of touch electrodes will be described with reference to FIGS. 4 and 7 to 9.

The first to third conductive layers 411, 412, and 413 include a plurality of first patterns 411x, 412x, and 413x which are patterned and arranged in a substantially horizontal direction, and a plurality of second patterns 411y, 412y, and 413y which are arranged in a substantially vertical direction. The first patterns 411x, 412x, and 413x of each of the conductive layers 411, 412, and 413 are formed to overlap one another, and the second patterns 411y, 412y, and 413y are also formed to overlap one another. When viewing the upper thin layer 400 from the top, the first patterns x and the plurality of second patterns y are formed to be alternately dispersed in a substantially horizontal direction.

As illustrated, the first pattern x and the second pattern y may be a rhombus type but are not limited thereto, and therefore may be, for example, a polygon such as a triangle, a quadrangle, and a hexagon.

A gap G is present between the first pattern x and the second pattern y, and the first patterns 411x, 412x, and 413x and the second patterns 411y, 412y, and 413y are physically and electrically separated from each other in the first to third conductive layers 411, 412, and 413 by the gap G. However, the first to third conductive layers 411, 412, and 413 are removed in the gap G, and therefore the external light may be incident into the display device through the gap G and the external light reflected from the inside of the display device may be output.

In the first conductive layer 411, the plurality of first patterns 411x are first touch electrodes and are connected to each other in the horizontal direction by a connection part 411c. In the first conductive layer 411, the plurality of second patterns 411y are dummy patterns and are separated from each other without being physically connected to each other in the first conductive layer 411, but are electrically connected in substantially the vertical direction through the second conductive layer 412.

In the second conductive layer 412, the plurality of second patterns 412y are second touch electrodes and are connected to each other in the vertical direction by a connection part 412c. In the second conductive layer 412, the plurality of first patterns 412x are dummy patterns and are separated from each other without being connected to each other.

Therefore, in the upper thin layer 400, the first conductive layer 411 is used as the first touch electrode and the second conductive layer 412 is used as the second touch electrode of a touch sensing sensor. That is, the first touch electrode and the second touch electrode which are adjacent to each other may form a mutual sensing capacitor which serves as the touch sensing sensor. One of the first touch electrode and the second touch electrode may be a sensing input electrode which receives a sensing input signal and the other may be a sensing output electrode which outputs a change in a charge amount due to the touch of external objects as a sensing output signal. The first touch electrode and the second touch electrode may be connected to a touch sensor controller (not illustrated) through a touch signal line (not illustrated), and the touch sensor controller processes the sensing output signal to be able to generate touch information on whether the external objects are touched, the touched position, and the like.

In the first conductive layer 411 and the second conductive layer 412, the dummy pattern serves as the anti-reflection layer rather than the touch electrode. However, when the second pattern 411y which is the dummy pattern of the first conductive layer 411 overlaps only the second pattern 412y which is the second touch electrode of the second conductive layer 412, an electric field formed between the first touch electrode and the second touch electrode is shielded and therefore the first touch electrode of the first conductive layer 411 and the second touch electrode of the second conductive layer 412 may not form the mutual sensing capacitor. Therefore, each second pattern 411y of the first conductive layer 411 is electrically connected to each second pattern 412y of the second conductive layer 412 by a connection part 420. The second pattern 412y of the second conductive layer 412 is connected in the vertical direction, and therefore the second pattern 411y of the first conductive layer 411 electrically connected to the second pattern 412y is also electrically connected in the vertical direction. As the result, the second pattern 411y may serve as the second touch electrode without shielding an electric field.

Figure 7:
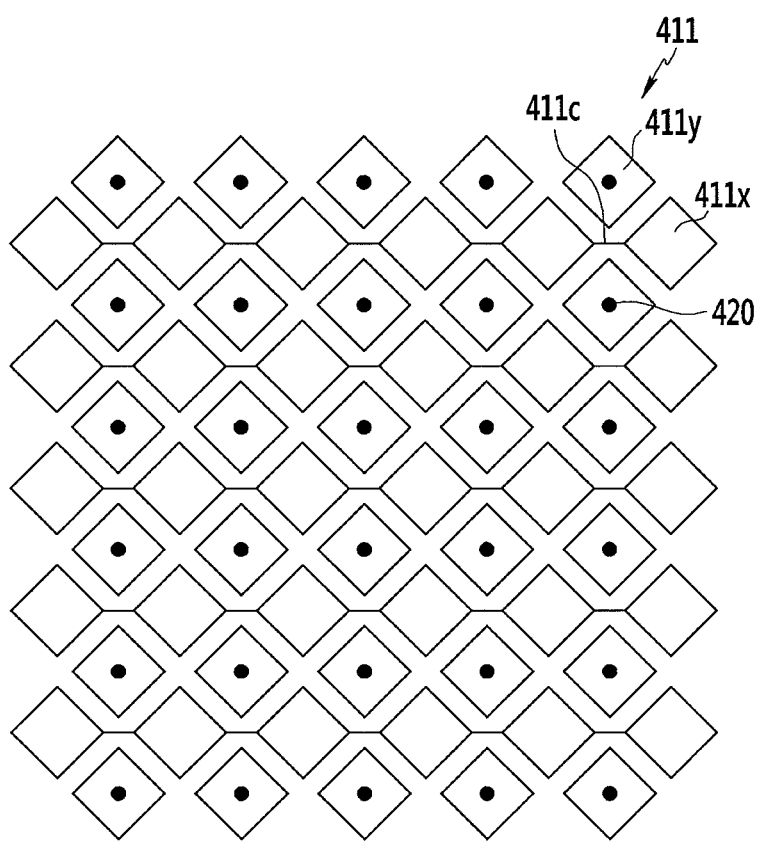
FIG. 7 is a plan view of a first conductive layer of the upper thin layer illustrated in FIG. 4.
Figure 8:
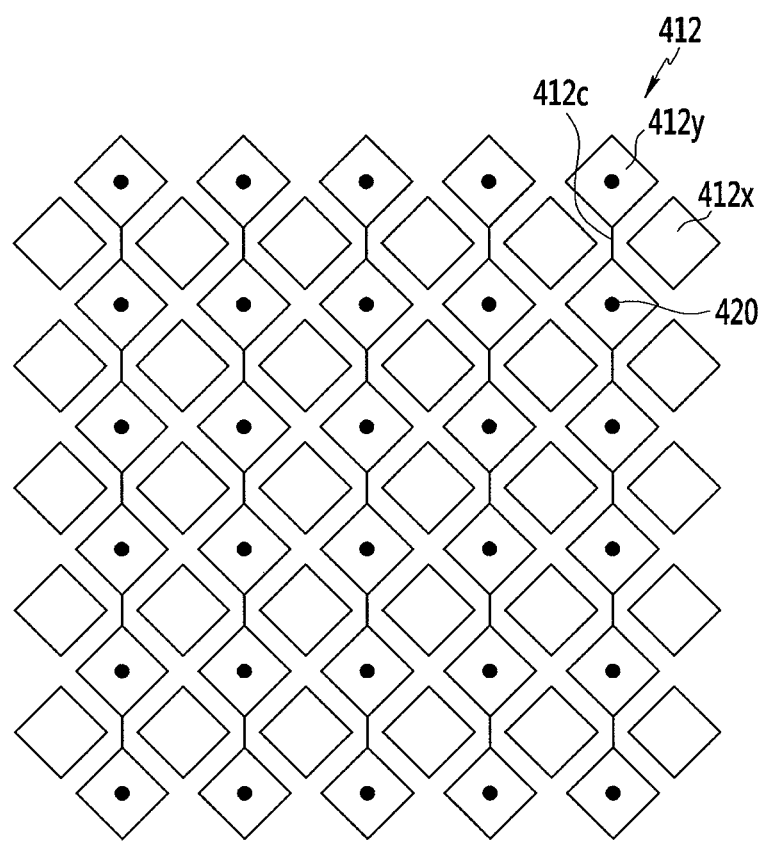
FIG. 8 is a plan view of a second conductive layer of the upper thin layer illustrated in FIG. 4.

The connection between the overlapping second patterns 411y and 412y by the connection part 420 may be made by forming, for example, the second conductive layer 412, forming the second dielectric layer 432 thereon, forming a contact hole at a place at which the connection part 420 is disposed, and then forming the first conductive layer 411 thereon so as to connect a portion of the first conductive layer 411 to the second conductive layer 412 through the contact hole. In FIGS. 7 and 8, dots represented at centers of each of the second patterns 411y and 412y indicate that the second patterns 411y of the first conductive layer 411 are vertically connected to the second patterns 412y of the second conductive layer 412 through the connection part 420.

When the third conductive layer 413 is formed under the second conductive layer 412 to physically and electrically contact the second conductive layer 412, even though the third conductive layer 413 is not intended to be used as the touch electrode, similar to the second conductive layer 412, the third conductive layer 413 is patterned in the first patterns 413x which are arranged in substantially the horizontal direction and the second patterns 413y which are arranged in the vertical direction. Otherwise, the first pattern 412x and the second pattern 412y of the second conductive layer 412 may be short-circuited to each other, because the third conductive layer 413 contacts the second conductive layer 412. The second patterns 413y of the third conductive layer 413 may be connected in substantially the vertical direction by a connection part 413c, but the first patterns 413x may not be connected to each other in any direction. The second pattern 413y of the third conductive layer 413 contacts the second pattern 412y of the second conductive layer 412 and therefore may serve as the second touch electrode.

Figure 9:
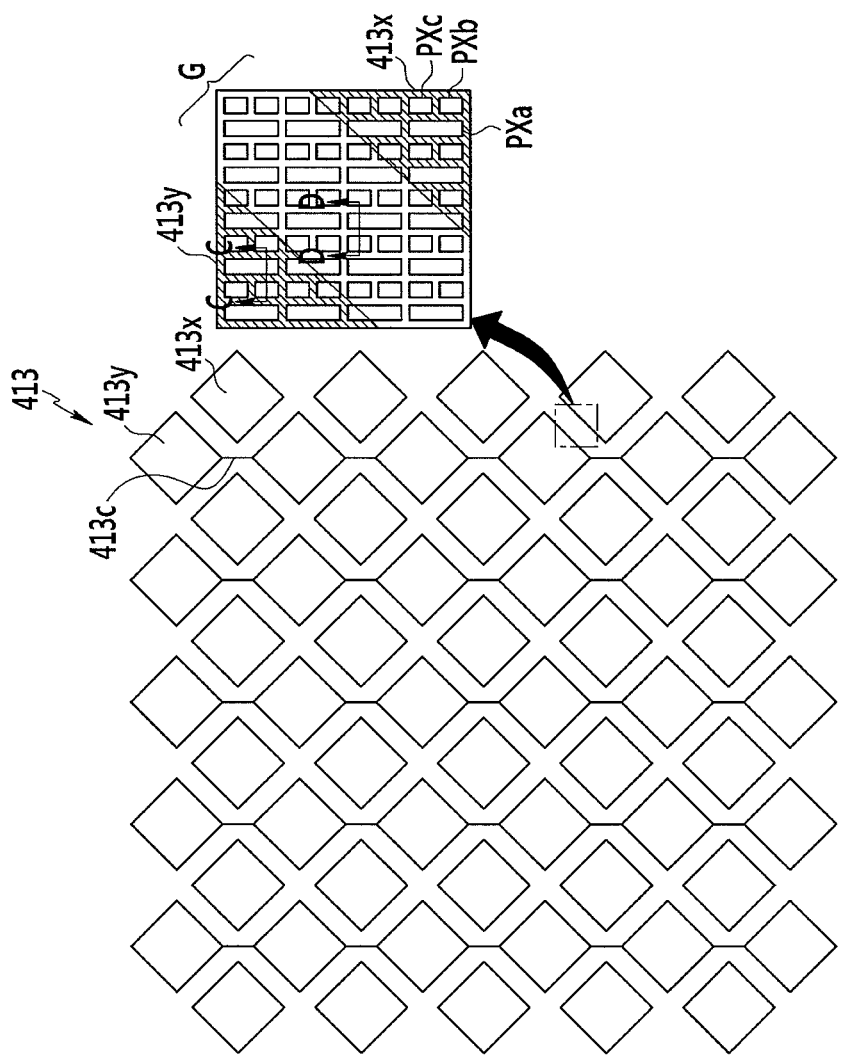
FIG. 9 is a plan view of a third conductive layer of the upper thin layer illustrated in FIG. 4.

FIG. 9 shows a partially enlarged view of some of the first patterns 413x and the second patterns 413y of the third conductive layer 413, and the gap G therebetween. In the partially enlarged view, pixels PXa, PXb, and PXc are illustrated as small rectangles. Each pixel PXa, PXb, and PXc may represent one of the three primary colors. For example, the PXa may be a blue pixel, the PXb may be a green pixel, and the PXc may be a red pixel. Each pixel may have the same area or different areas, and a pixel representing any one of the three primary colors may be larger than the others as illustrated. Each pixel PXa, PXb, and PXc corresponds to a pixel area PA, and an area therearound corresponds to a non-pixel area NA. The electrode layer forming the common electrode of the OLED may be formed over the pixel area PA and the non-pixel area NA.

The first to third conductive layers 411, 412, and 413 are not present in the gap G to form the touch electrodes by separating the patterns (for example, in a state in which the first to third conducive layers 411, 412, and 413 are removed by patterning). Therefore, the external light is incident into the display device through the gap G, and the external light may be reflected by a reflective material such as the common electrode which is formed in the display device and exit through the gap G. The reflection of external light increases due to the light leakage phenomenon through the gap G and therefore the visibility deteriorates. According to some embodiments, to reduce the light leakage phenomenon through the gap G, a light absorbing member is formed at the overlapping position with the non-pixel area NA.

The light absorbing member may be formed at the overlapping position with the non-pixel area NA which is not covered by the first to third conductive layers 411, 412, and 413 due to the gap G. The light absorbing member may be formed to overlap the non-pixel area NA even in the pattern area covered by the first pattern x or the second pattern y. In this case, the third conductive layer 413 may not be formed.

The light absorbing member may be formed of organic materials such as carbon black and ink, or inorganic materials such as CrOx/Cr, MoOx/Mo, $Nb_2O_5$/Mo, and CuOx, and may be formed of an organic and inorganic composite material.

Meanwhile, the pixel area PA and the non-pixel area NA which does not overlap the gap G and are present in the pattern area are covered by the first and second conductive layers 411 and 412, but only the non-pixel area NA is covered by the third conductive layer 413. As described above, the third conductive layer 413 is formed to be thicker than the first and second conductive layers 411 and 412 to further reduce light transmittance. If the third conductive layer 413 is formed on the pixel area PA to overlap the pixel area PA, the third conductive layer will reduce the exit of internal light from the OLED to the outside, therefore the third conductive layer 413 is not formed on the pixel area PA.

Therefore, even though the entire shape of the patterns 413x and 413y of the third conductive layer 413 is substantially the same as the entire shape of the patterns 411x, 411y, 412x, and 412y of the first and second conductive layers 411 and 412, each pattern 413x and 413y has detailed patterns in which only the overlapping portion of the non-pixel area NA is formed. The partially enlarged view of FIG. 9 also illustrates an example of detailed patterns of the patterns 413x and 413y, in which the patterns 413x and 413y are formed only in a shaded portion corresponding to the non-pixel area NA and are not formed on the pixels PXa, PXb, and PXc corresponding to the pixel area PA.

Hereinafter, FIGS. 10 to 15 illustrate an example of a formation position of the light absorbing member in the stacked structure of the OLED display.

Figure 13:
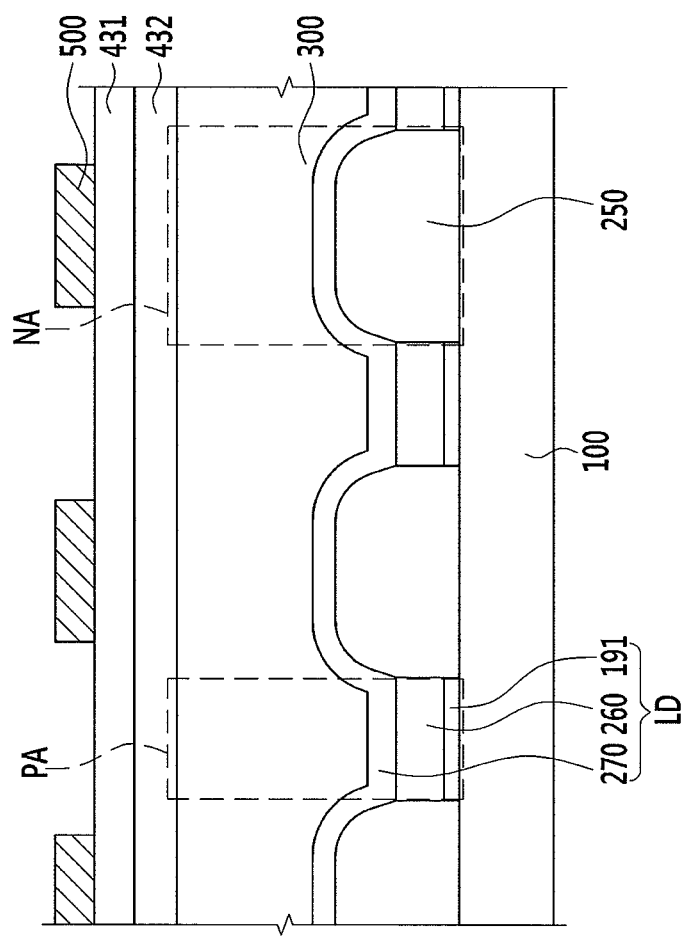
Figure 14:
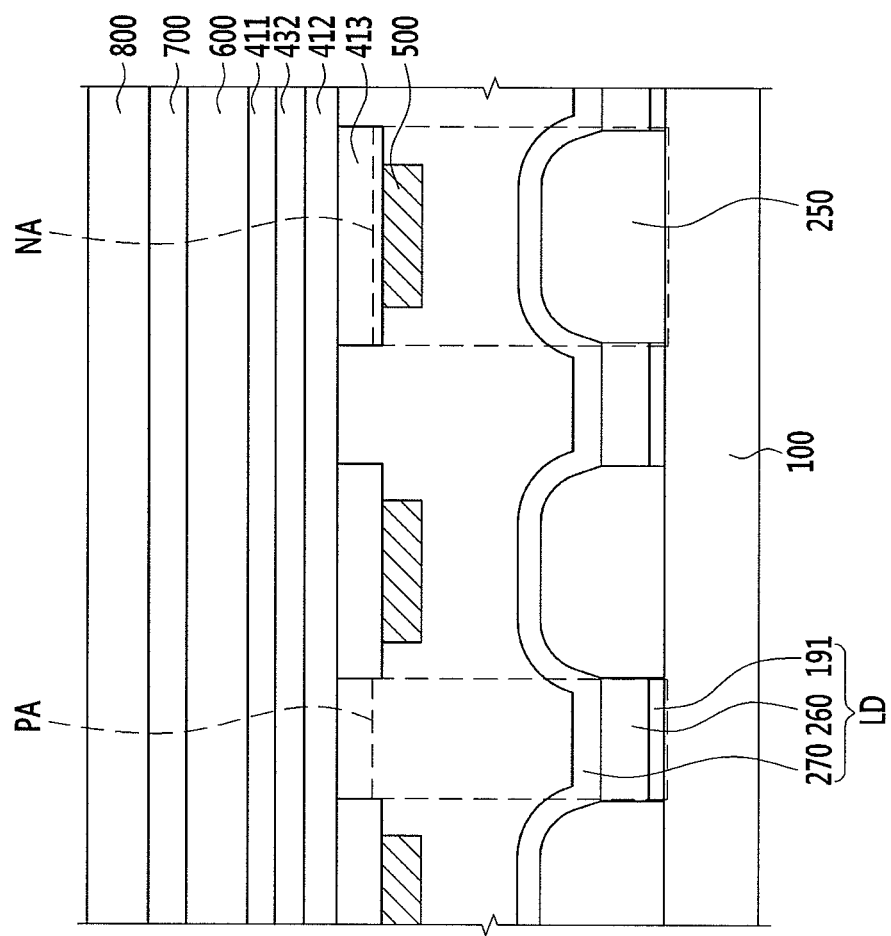
FIGS. 14 and 15 are each cross-sectional views taken along the positions corresponding to the lines C-C and D-D of FIG. 9 in the OLED display according to an embodiment.
Figure 15:
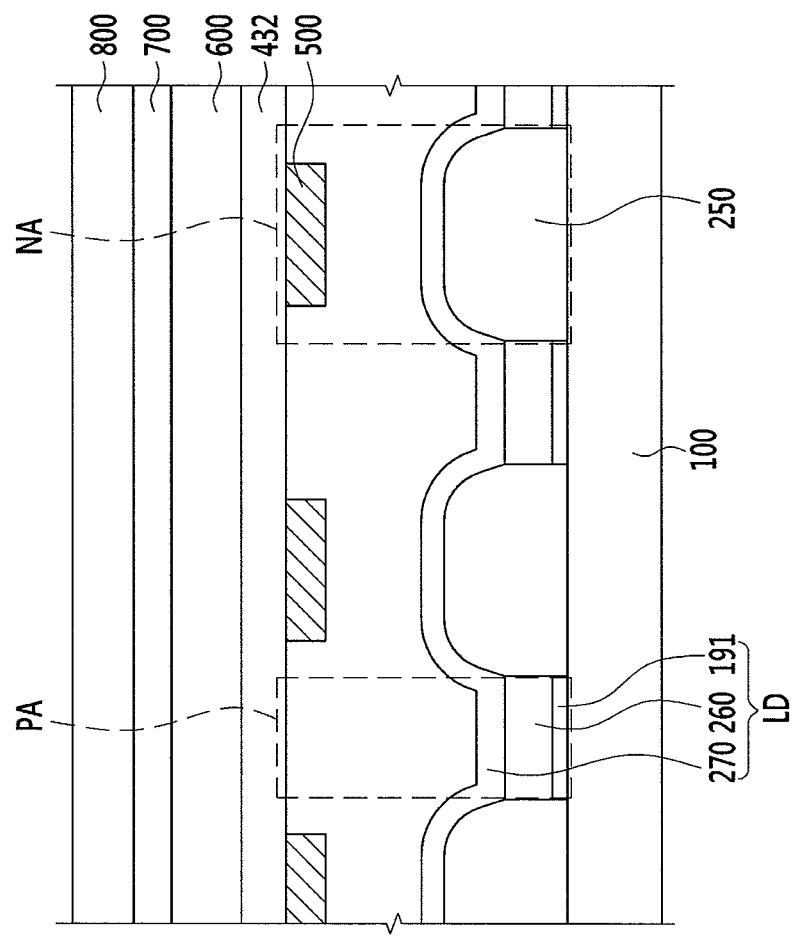

In FIG. 9, a cross-sectional view taken along the line C-C or D-D throughout two pixels does not illustrate only a cross-section of the third conductive layer 413, but also illustrates a cross-section of the OLED display. To avoid complexity of the drawings, FIGS. 10 to 15 do not illustrate the thin film transistor, the signal line, and the like which are formed between the lower substrate 100 and the pixel electrode 191. FIGS. 10 to 13 illustrate an example of the OLED display having the structure in which the encapsulation layer 300 is formed on the display layer, and FIGS. 14 and 15 illustrate an example of the OLED display having a structure in which an encapsulation substrate 600 such as glass is formed on the display layer.

Figure 10:
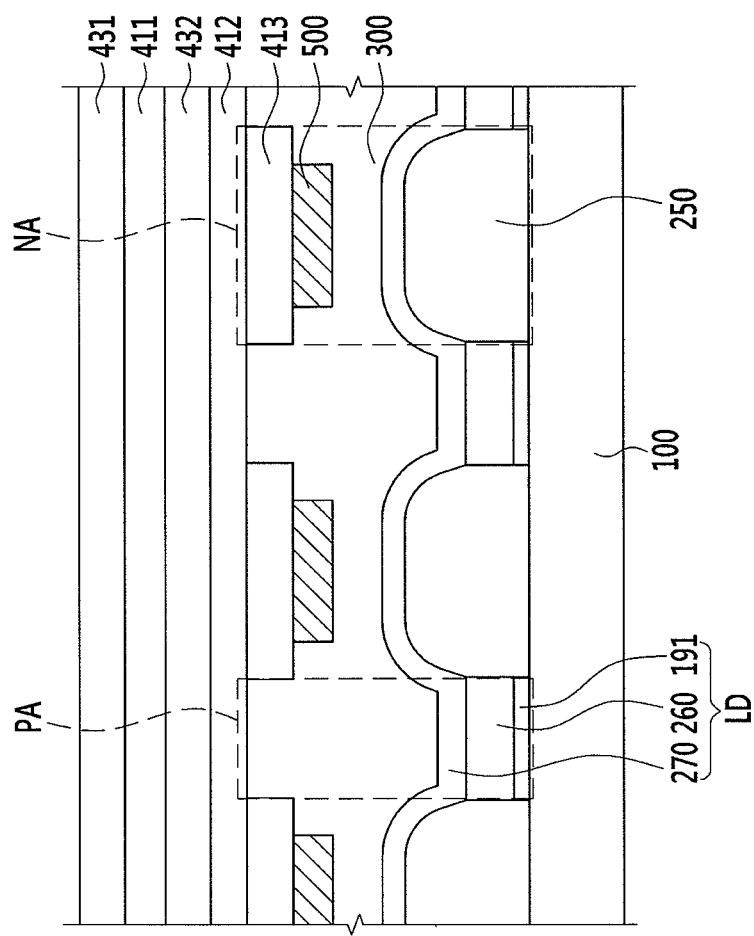
FIG. 10 is a cross-sectional view taken along a position corresponding to the line C-C of FIG. 9 in the OLED display according to an embodiment.
Figure 11:
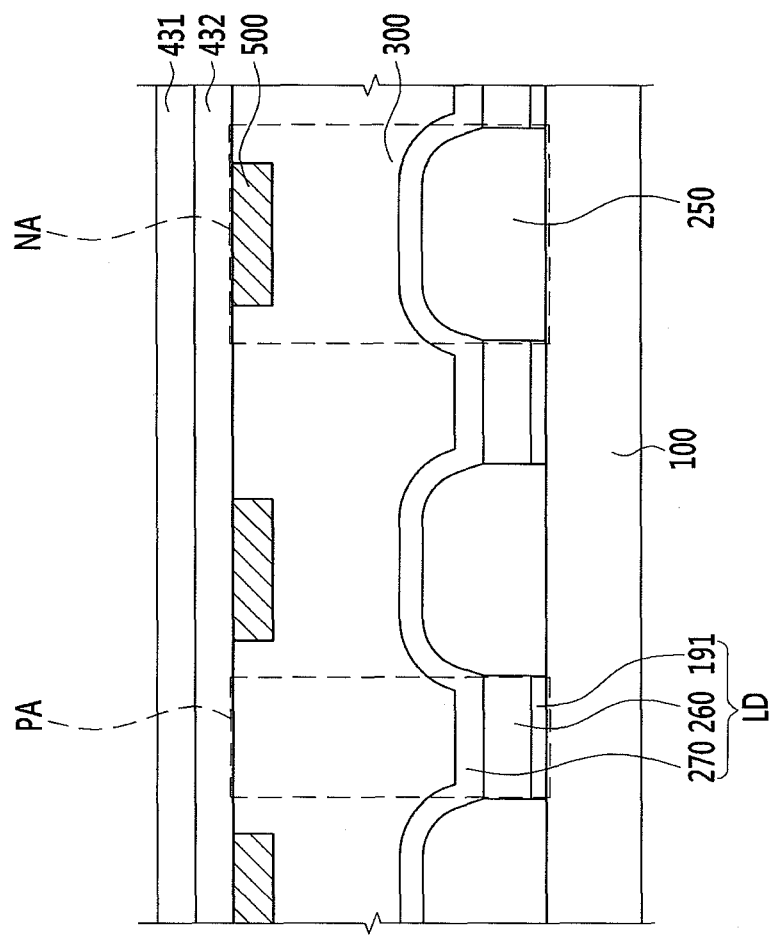
FIGS. 11 to 13 are cross-sectional views taken along a position corresponding to the line D-D of FIG. 9 in the OLED display according to some embodiments.

First, referring to FIGS. 10 and 11, FIG. 10 illustrates a cross-section of a portion (pattern region) in which the first and second patterns are formed by the first to third conductive layers 411, 412, and 413 in the OLED display, and FIG. 11 illustrates a gap (G) portion (gap region) in which the pattern is not formed. In the cross-sectional view of FIG. 10, the first to third conductive layers 411, 412, and 413 form the anti-reflection layer capable of reducing the reflection of external light in the pattern region, but in the cross-sectional view of FIG. 11, the first to third conductive layers are removed to form the touch electrode and therefore only the first and second dielectric layers 431 and 432 are present. Since the conductive layer for preventing the external light from being reflected is not present in the gap region, a light absorbing member 500 formed to overlap the non-pixel area NA may be formed to reduce the light leakage phenomenon through the gap region, and the light absorbing member 500 may be, for example, formed between the encapsulation layer 300 and the second dielectric layer 432. The width of the light absorbing member 500 may be substantially equal to or narrower than that of the pixel defining layer 250 corresponding to the non-pixel area NA, and may be formed so as to not hinder light from exiting from the OLED display to the outside of the display device.

In the pattern region in which the first to third conductive layers 411, 412, and 413 illustrated in FIG. 10 are disposed, the reflection of external light may be reduced by the conductive layers, but in order to further increase the reflectance, the light absorbing member 500 may be formed to overlap the non-pixel area NA so as to not hinder light from being emitted from the OLED. The light absorbing member 500 formed in the pattern region may be formed using the same mask as the light absorbing member 500 formed in the gap region, and therefore an additional process is not required. The light absorbing member 500 may not be formed in the pattern region, and the light absorbing member 500 may be formed in the pattern region but the third conductive layer 413 may not be formed in the pattern region.

Figure 12:
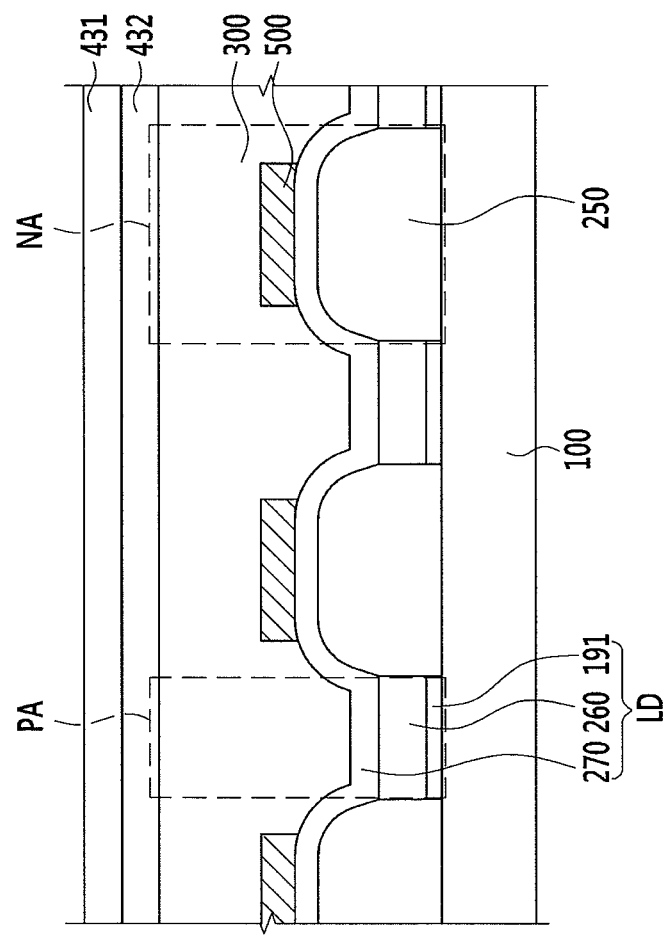

FIG. 12 illustrates an example in which the light absorbing member 500 which overlaps the non-pixel area NA but does not overlap the pixel area PA is formed between the common electrode 270 and the encapsulation layer 300. In the case in which the OLED display is the top emission type, even though the common electrode 270 is light transmissive, the external light may be reflected by the common electrode 270. To prevent the external light from reflecting due to the common electrode 270, the light absorbing member 500 may be formed on the common electrode 270. FIG. 13 illustrates the example in which the light absorbing member 500 is formed on the first dielectric layer 431. In this case, the region in which the external light may be incident into the display device and exit therefrom without hindering the emission of internal light is reduced.

FIGS. 14 and 15 are cross-sectional views of the OLED display having the structure in which the encapsulation substrate 600 such as glass is formed on the display layer. Referring to FIG. 14 corresponding to the pattern region, the first to third conductive layers 411, 412, and 413 are formed below the encapsulation substrate 600. The first to third conductive layers 411, 412, and 413 are patterned to form the touch electrode layer. The dielectric layer 432 is formed between the first conductive layer 411 and the second conductive layer 412. The dielectric layer which is formed on the first conductive layer 411 may be omitted in the present embodiment. The layer structure as described above may be formed by sequentially forming the first conductive layer 411, the dielectric layer 432, the second conductive layer 412, and the third conductive layer 413 on the encapsulation substrate 600, and attaching the encapsulation substrate 600 to the lower substrate 100 side so as to direct the surface on which these layers are formed to the lower substrate 100. A window 800 may be attached on the encapsulation substrate 600 through an adhesive layer 700.

Referring to FIG. 15, as the illustrated section corresponds to the gap region, the first to third conductive layers are not present and the dielectric layer 432 is formed just below the encapsulation substrate 600. The light absorbing member 500 is formed below the dielectric layer 432 to overlap the non-pixel area NA. The light absorbing member 500 may be formed over the common electrode 270 and may also be formed over the encapsulation substrate 600.

While the inventive technology has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a display layer formed over the substrate and including a pixel area and a non-pixel area;
   an upper thin layer formed over the display layer, wherein the upper thin layer comprises at least first and second conductive layers and a dielectric layer formed between the first and second conductive layers, wherein the second conductive layer is closer to the substrate than the first conductive layer, and wherein the first and second conductive layers are patterned as touch electrodes;
   a light absorbing member at least partially overlapping the non-pixel area and not overlapping the pixel area; and
   a third conductive layer formed below the second conductive layer and patterned so as to not overlap the pixel area.

2. The OLED display of claim 1, wherein the first conductive layer includes a plurality of first touch electrodes arranged in a first direction and a plurality of first non-touch electrode patterns arranged in a second direction crossing the first direction and separated from the first touch electrodes, and wherein the first touch electrodes are connected to each other in the first direction.

3. The OLED display of claim 2, wherein the second conductive layer includes a plurality of second touch electrodes arranged in the second direction and a plurality of second non-touch electrode patterns arranged in the first direction and separated from the second touch electrodes, and wherein the second touch electrodes are connected to each other in the second direction.

4. The OLED display of claim 3, wherein the first touch electrodes of the first conductive layer substantially overlap the second non-touch electrode patterns of the second conductive layer, and wherein the first non-touch electrode patterns of the first conductive layer substantially overlap the second touch electrodes of the second conductive layer.

5. The OLED display of claim 4, wherein the non-touch electrode patterns of the first conductive layer are respectively connected to the second touch electrodes of the second conductive layer which at least partially overlaps the first conductive layer.

6. The OLED display of claim 5, wherein the non-touch electrode patterns of the first conductive layer and the second touch electrodes of the second conductive layer are respectively connected to each other through contact holes which are formed in the dielectric layer between the first conductive layer and the second conductive layer.

7. The OLED display of claim 6, wherein the first and second touch electrodes form a mutual sensing capacitor.

8. The OLED display of claim 1, wherein the third conductive layer has a thickness greater than that of the first conductive layer and the second conductive layer.

9. The OLED display of claim 1, further comprising:
   an encapsulation layer formed between the display layer and the upper thin layer.

10. The OLED display of claim 9, wherein the upper thin layer further includes a dielectric layer which is formed over the first conductive layer.

11. The OLED display of claim 9, wherein the light absorbing member is formed between the encapsulation layer and the upper thin layer.

12. The OLED display of claim 9, wherein the light absorbing member is formed between the display layer and the encapsulation layer.

13. The organic OLED display of claim 9, wherein the light absorbing member is formed over the upper thin layer.

14. The OLED display of claim 1, wherein the light absorbing member is formed of one or more of the following: carbon black, ink, CrOx/Cr, MoOx/Mo, $Nb_2O_5$/Mo, and CuOx.

15. The OLED display of claim 1, further comprising:
   an encapsulation substrate formed over the upper thin layer,
   wherein the first conductive layer contacts the encapsulation substrate.

16. The OLED display of claim 1, wherein the light absorbing member at least partially overlaps the non-pixel area which is not covered by the first and second conductive layers when viewed from the top.

17. An organic light-emitting diode (OLED) display, comprising:
   a pixel area and a non-pixel area formed in and over a substrate;
   first and second conductive layers, wherein the second conductive layer is closer to the substrate than the first conductive layer, and wherein the first and second conductive layers form a touch electrode;
   a dielectric layer formed between the first and second conductive layers; and
   a light absorbing member at least partially overlapping the non-pixel area and not overlapping the pixel area; and
   a third conductive layer formed below the second conductive layer and patterned so as to not overlap the pixel area.

18. The OLED display of claim 17, wherein the first conductive layer comprises i) a plurality of first touch electrodes arranged and connected to each other in a first direction and ii) a plurality of first non-touch electrode patterns arranged in a second direction crossing the first direction and separated from the first touch electrodes, wherein the second conductive layer comprises i) a plurality of second touch electrodes arranged and connected to each other in the second direction and ii) a plurality of second non-touch electrode patterns arranged in the first direction and separated from the second touch electrodes.

19. The OLED display of claim 1, wherein the second and third conductive layers have different widths.

* * * * *